United States Patent
Sun et al.

(10) Patent No.: US 12,108,641 B2
(45) Date of Patent: Oct. 1, 2024

(54) DISPLAY PANEL INTERCONNECTION LINE CONFIGURATIONS

(71) Applicants: KUNSHAN NEW FLAT PANEL DISPLAY TECHNOLOGY CENTER CO., LTD., Jiangsu (CN); KUNSHAN GO-VISIONOX OPTO-ELECTRONICS CO., LTD., Jiangsu (CN)

(72) Inventors: Guangyuan Sun, Kunshan (CN); Zhenzhen Han, Kunshan (CN); Siming Hu, Kunshan (CN); Zhengyong Zhu, Kunshan (CN)

(73) Assignees: KUNSHAN NEW FLAT PANEL DISPLAY TECHNOLOGY CENTER CO., LTD., Kunshan (CN); KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 456 days.

(21) Appl. No.: 17/500,160

(22) Filed: Oct. 13, 2021

(65) Prior Publication Data
US 2022/0037453 A1    Feb. 3, 2022

Related U.S. Application Data

(63) Continuation of application No. PCT/CN2020/091313, filed on May 20, 2020.

(30) Foreign Application Priority Data
Sep. 19, 2019    (CN) .......................... 201910888406.0

(51) Int. Cl.
H10K 59/131    (2023.01)

(52) U.S. Cl.
CPC .................................. *H10K 59/131* (2023.02)

(58) Field of Classification Search
CPC ....................... H10K 59/131; H10K 2102/341
See application file for complete search history.

(56) References Cited

U.S. PATENT DOCUMENTS 10,600,812 B2 *    3/2020    Hsu ..................... G02F 1/13439
11,316,001 B2 *    4/2022    Cho .......................... G09G 3/20
(Continued)

FOREIGN PATENT DOCUMENTS

CN    102117826 A    7/2011
CN    105575994 A    5/2016
(Continued)

OTHER PUBLICATIONS

Office Action issued on May 5, 2022, in connection with corresponding Chinese Application No. 201910888406.0 (15 pp., including machine-generated English translation).
(Continued)

*Primary Examiner* — Mamadou L Diallo
(74) *Attorney, Agent, or Firm* — Maier & Maier, PLLC

(57) ABSTRACT

A display panel includes a substrate. The substrate includes a display area, a bonding area disposed on one side of the display area and a fan-out area disposed between the bonding area and the display area. The fan-out area includes at least two metal layers, a first planarization layer and a first interconnection line layer which are stacked on a surface of the substrate.

20 Claims, 4 Drawing Sheets

(56) References Cited

U.S. PATENT DOCUMENTS

| | | | |
|---|---|---|---|
| 2013/0267055 A1* | 10/2013 | Ro | B32B 3/266 427/532 |
| 2018/0219165 A1* | 8/2018 | Kwon | H10K 59/8792 |
| 2019/0012031 A1* | 1/2019 | Kim | H10K 59/38 |
| 2019/0280074 A1* | 9/2019 | Li | H10K 50/82 |
| 2020/0067000 A1* | 2/2020 | Li | H05K 1/0393 |
| 2020/0192507 A1* | 6/2020 | Bu | G02F 1/13439 |
| 2020/0194468 A1* | 6/2020 | Luo | H01L 27/1248 |
| 2020/0295111 A1* | 9/2020 | Bai | H10K 59/131 |
| 2021/0028396 A1* | 1/2021 | Guo | H10K 59/131 |
| 2021/0119177 A1* | 4/2021 | Bang | H10K 50/844 |
| 2021/0159292 A1* | 5/2021 | Zhang | H10K 59/124 |
| 2021/0333591 A1* | 10/2021 | Du | G02F 1/133331 |
| 2021/0335977 A1* | 10/2021 | Yang | H10K 59/131 |
| 2021/0408081 A1* | 12/2021 | Liu | H01L 29/78675 |

FOREIGN PATENT DOCUMENTS

| | | | | |
|---|---|---|---|---|
| CN | 105652544 A | | 6/2016 | |
| CN | 107121860 A | * | 9/2017 | G02F 1/136286 |
| CN | 107331294 A | | 11/2017 | |
| CN | 107808897 A | | 3/2018 | |
| CN | 107818992 A | | 3/2018 | |
| CN | 107833906 A | | 3/2018 | |
| CN | 108183108 A | | 6/2018 | |
| CN | 108598142 A | | 9/2018 | |
| CN | 108873508 A | * | 11/2018 | G02F 1/13338 |
| CN | 109244105 A | | 1/2019 | |
| CN | 109697958 A | | 4/2019 | |
| CN | 109728043 A | | 5/2019 | |
| CN | 109801949 A | * | 5/2019 | G06F 1/1637 |
| CN | 110085635 A | | 8/2019 | |
| CN | 110379310 A | * | 10/2019 | G06F 3/0412 |
| KR | 20080035369 A | | 4/2008 | |

OTHER PUBLICATIONS

Supplemental Search Report issued on Feb. 25, 2022, in connection with corresponding Chinese Application No. 201910888406.0 (3 pp., including machine-generated English translation).

International Search Report issued on Aug. 19, 2020 in corresponding International application No. PCT/CN2020/091313; 5 pages.

First Office Action and Search Report issued on Jun. 23, 2021 in corresponding Chinese application No. 201910888406.0; 15 pages including Machine-generated English-language translation.

* cited by examiner

DISPLAY PANEL INTERCONNECTION LINE CONFIGURATIONS

CROSS-REFERENCE TO RELATED APPLICATIONS

This is a continuation of International Patent Application No. PCT/CN2020/091313, filed on May 20, 2020, which claims priority to Chinese Patent Application No. 201910888406.0 filed on Sep. 19, 2019, the disclosures of which are incorporated herein by reference in their entireties.

TECHNICAL FIELD

Embodiments of the present application relate to display technologies, for example, a display panel.

BACKGROUND

With the development of mobile phone market, the full-screen technology has gained popularity among market users. In the trend towards full screens, the bezels of display panels have been increasingly narrow. However, the narrower bezels further squeeze the room for metal wires, making metal wires more prone to be short-circuited.

SUMMARY

The present application provides a display panel to avoid short circuits between interconnection lines in a first interconnection line layer while ensuring a relatively narrow bezel of the display panel so that the display panel has relatively good display performance.

The display panel includes a substrate. The substrate includes a display area, a bonding area disposed on one side of the display area, and a fan-out area disposed between the bonding area and the display area.

The fan-out area includes at least two metal layers, a first planarization layer, and a first interconnection line layer which are stacked on a surface of the substrate.

In embodiments of the present application, the first planarization layer is disposed between the first interconnection line layer and the at least two metal layers, and the first planarization layer can planarize a non-planar surface formed by the processing of the at least two metal layers. Thus, the first interconnection line layer can be manufactured on a planar surface. If the first interconnection line layer is manufactured on a non-planar surface, photoresist residues formed in the photolithographic process will make a part of the metal fail to be etched away, this will cause short circuits between the interconnection lines. Therefore, the scheme of this embodiment avoids short circuits between the interconnection lines in the first interconnection line layer while ensuring a relatively narrow bezel of the display panel, so that the display panel has relatively good display performance.

DETAILED DESCRIPTION

Figure 1:
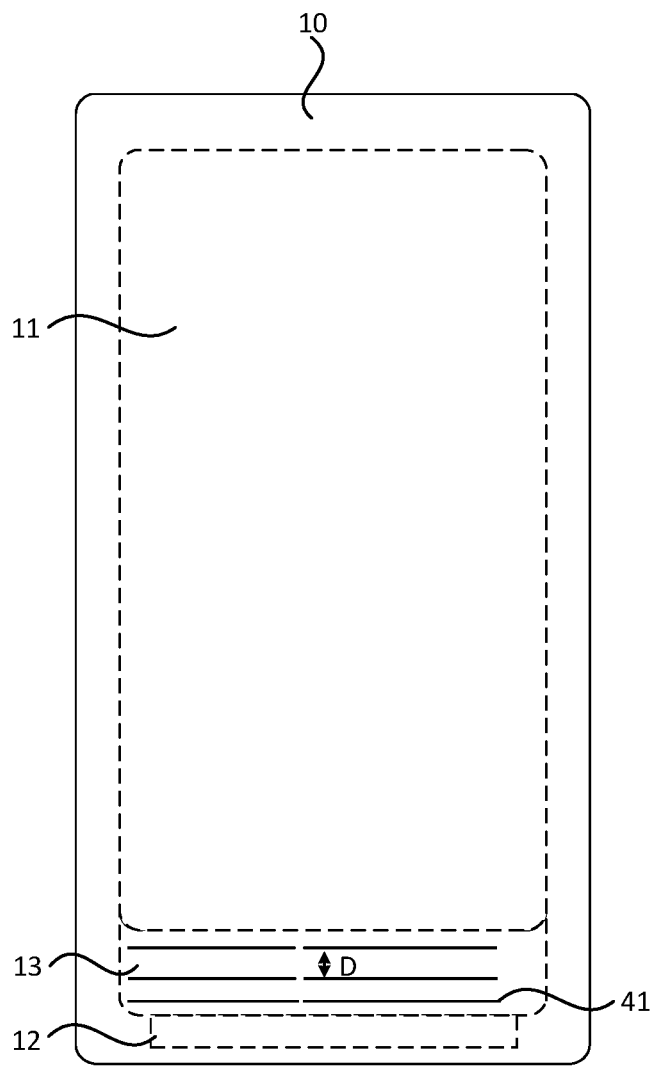
FIG. 1 is a top view of a display panel according to an embodiment of the present application.

The present application will be described below in conjunction with the drawings and the embodiments. The embodiments described below are intended to explain and not to limit the present application. Additionally, for ease of description, only part, not all, of structures related to the present application are illustrated in the drawings.

As mentioned in the Background section, the narrower bezels of display panels squeeze the room for metal wires, making metal wires easily short-circuited. The reason for this situation lies in that a plurality of metal wire layers are typically disposed in a bezel of a display panel. The insulating layer between the metal wire layers is generally an inorganic layer which is relatively thin. With the increasing number of metal wire layers, the surface of a metal wire layer would be non-planar. In this case, photoresist residues are easily generated during the subsequent manufacturing of metal wire layers, thus making some of the metal fail to be etched away and causing short circuits between metal wires.

Figure 2:
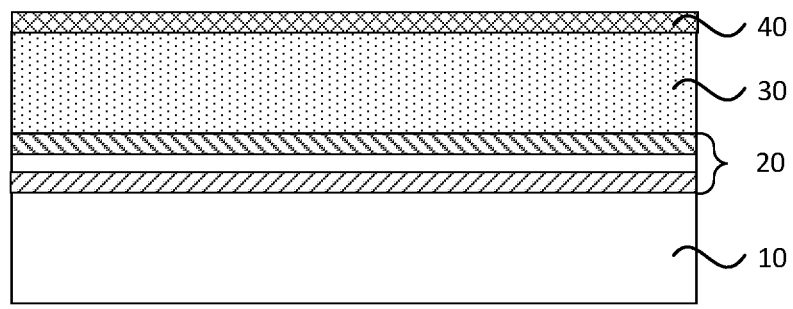
FIG. 2 is a section view of a fan-out area according to an embodiment of the present application.

This embodiment provides a display panel. Referring to FIGS. 1 and 2, the display panel includes a substrate 10 including a display area 11, a bonding area 12 disposed on one side of the display area 11, and a fan-out area 13 disposed between the bonding area 12 and the display area 11. The fan-out area 13 includes at least two metal layers 20, a first planarization layer 30, and a first interconnection line layer 40 which are stacked on a surface of the substrate 10.

The bonding area 12 is configured for bonding a driver chip. The fan-out area 13 is disposed between the bonding area 12 and the display area 11. The fan-area 13 is used for arrangement of at least one leading-out wire which leads at least one data line of the display area and at least one power line of the display area 11 to the bonding area 12, and the fan-out area 13 is also used for arrangement of some scanning signal lines and some resetting signal lines that provide scanning signals and resetting signals for at least one pixel driving circuit. The first interconnection line layer 40 may include a plurality of scanning signal lines, a plurality of resetting signal lines, and a plurality of power leading-out wires. The first planarization layer 30 is made of an organic material. Exemplarily, the first planarization layer 30 may be made of an organic adhesive for exposure.

The first planarization layer 30 may planarize the non-planar surface formed by the processing of the at least two metal layers 20. Thus, the first interconnection line layer 40 can be manufactured on a planar surface. This manner can avoid that the first interconnection line layer 40 is manufactured on the non-planar surface, photoresist residues formed in the photolithographic process makes a part of the metal fail to be etched away, thus causing short circuits between the interconnection lines. Therefore, in the scheme of this embodiment, the first planarization layer 30 is disposed between the first interconnection line layer 40 and the at least two metal layers 20 to avoid short circuits between interconnection lines in the first interconnection line layer 40 while ensuring a relatively narrow bezel of the display panel, so that the display panel has relatively good display performance.

The first interconnection line layer 40 includes a plurality of first interconnection lines 41. The distance D between two adjacent first interconnection lines 41 is less than or equal to 8 microns.

The first interconnection lines 41 may include scanning signal lines, resetting signal lines, and power leading-out wires. Exemplarily, the power leading-out wires may include at least one first power signal leading-out wire and at least one second power signal leading-out wire. The first power signal leading-out wire is configured to provide a first power signal VDD for a pixel driving circuit. The second power signal leading-out wire is configured to provide a second power signal VSS for a cathode of an organic light-emitting diode.

The configuration in which the distance between two adjacent first interconnection lines 41 is less than or equal to 8 microns ensures a relatively small width of the fan-out area 13, thus ensuring a relatively narrow bezel of the display panel. Additionally, in the scheme of this embodiment, the first planarization layer 30 is disposed between the first interconnection line layer 40 and the at least two metal layers 20, thereby avoiding short circuits between the first interconnection lines 41 in the case that the distance D between two adjacent first interconnection lines 41 is less than or equal to 8 microns. In this case, the display panel has a relatively good display performance when designed with a relatively narrow bezel.

FIG. 1 only exemplarily illustrates that the first interconnection lines 41 extend along the extending direction of the boundary where the display area 11 intersects the fan-out area 13, not limiting the present application. In other embodiments, the first interconnection lines 41 may extend along other directions. Additionally, the distance between the first interconnection lines 41 is not limited in this embodiment and may be set according to the requirements of the panel. Exemplarily, the distance between the first interconnection lines 41 may be set to 5 microns to avoid short circuits between the first interconnection lines 41 in the case of a relatively small distance D between the first interconnection lines 41. In this case, the display panel has a relatively good display performance when designed with a relatively narrow bezel.

In an embodiment, the fan-out area 30 further includes a third insulating layer disposed between two adjacent metal layers.

The range of the thickness of the first planarization layer 30 may be 1 micron to 2 microns.

When a thickness of the first planarization layer 30 is too small, a planarization performance of the first planarization layer 30 is relatively poor; when a thickness of the first planarization layer 30 is too large, it is not conducive to reducing the thickness of the display panel. The configuration in which the thickness of the first planarization layer 30 is in the range of 1 to 2 microns, on one hand, it avoids short circuits between the interconnection lines due to the non-planar surface formed by the manufacturing process of the at least two metal layers 20; on the other hand, it ensures a relatively small thickness of the display panel and follows the trend towards lightness and thinness of the display panel.

The thickness of the first planarization layer 30 is not limited in this embodiment and may be determined based on the degree of non-planarity of the surface formed by the manufacturing process of the at least two metal layers 20.

Exemplarily, the thickness of the first planarization layer 30 may be set to 1.3 microns, 1.5 microns, or 1.7 microns.

Figure 3:
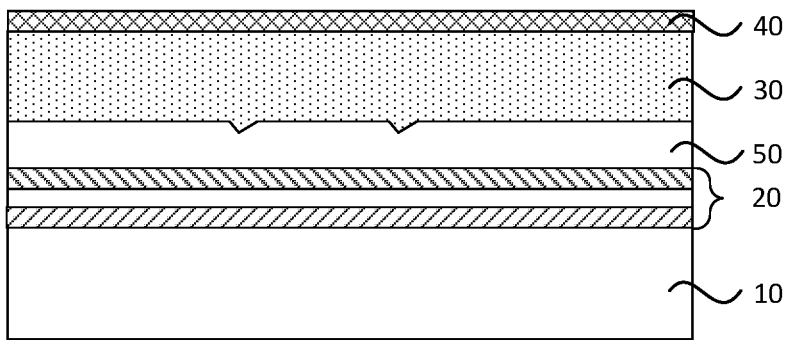
FIG. 3 is a section view of another fan-out area according to an embodiment of the present application.

Referring to FIG. 3, the display panel further includes a first insulating layer 50 disposed between the at least two metal layers 20 and the first planarization layer 30.

The first insulating layer 50 is made of an inorganic material. For example, it may be made of a silicon nitride material or a silicon oxide material. As an inorganic material has a better insulation performance over an organic material, the first insulating layer 50 provides a relatively good insulation between the first planarization layer 30 and metal wires in the metal layer among the at least two metal layers 20 and adjacent to the first interconnection line layer 40. Moreover, the first insulating layer 50 provides a relatively good insulation between the first interconnection line layer 40 and the metal layer among the at least two metal layers 20 and adjacent to the first interconnection line layer 40. This avoids an interference among a plurality of metal wires and ensures a relatively good display performance of the display panel.

Figure 4:
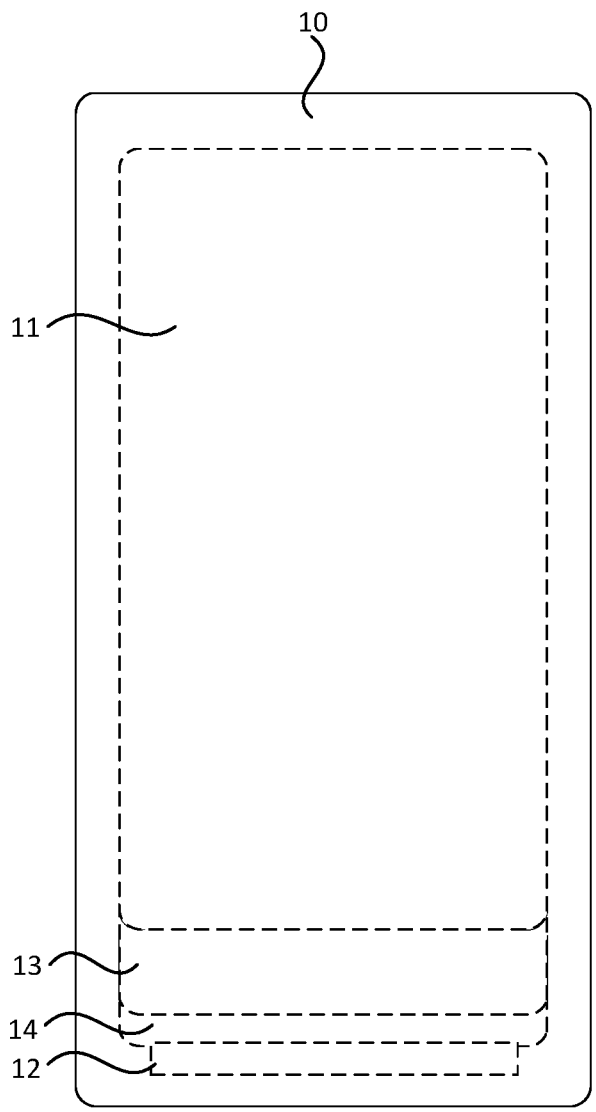
FIG. 4 is a top view of another display panel according to an embodiment of the present application.
Figure 5:
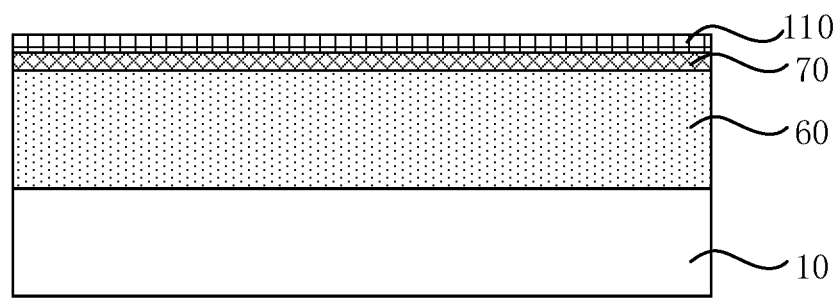
FIG. 5 is a section view of a bending area according to an embodiment of the present application.

Referring to FIGS. 4 and 5, the substrate 10 further includes a bending area 14 disposed between the fan-out area 13 and the bonding area 12. The bending area 14 includes an organic layer 60 which is disposed on the surface of the substrate 10, and the organic layer 60 and the first planarization layer 30 are disposed in the same layer.

The bending area 14 is an area of the display panel that has been deformed by bending. The bending area 14 is bent towards a side of the substrate 10 facing away from the light-emitting surface of the display panel, so that the bonding area 12 is bent to the back surface of the display panel to further narrow the bezel of the display panel.

The first planarization layer 30 and the organic layer 60 of the bending area 14 are disposed in the same layer, so that the first planarization layer 30 and the organic layer 60 may be manufactured in the same process by using the same material and the same mask; therefore, the cost of the material and the cost of the manufacturing process of the display panel are reduced.

The bending area 14 may further include a first metal layer 70 disposed on the side of the organic layer 60 facing away from the substrate 10. The first metal layer 70 and the first interconnection line layer 40 are disposed in the same layer.

The first metal layer 70 includes a plurality of first metal wires. The first metal wires may include a leading-out wire which leads at least one data line of the display area 11 and at least one power line of the display area 11 to the bonding area 12.

The first metal layer 70 and the first interconnection line layer 40 are disposed in the same layer, the first metal layer 70 and the first interconnection line layer 40 may be manufactured in the same process by using the same material and the same mask; therefore, the cost of the material and the cost of the manufacturing process of the display panel are reduced.

The first interconnection line 41 may adopt a stacked structure of Ti/Al/Ti.

Because of a relatively good bending resistance of aluminum (Al), each of the first interconnection lines 41 adopts the stacked structure of Ti/Al/Ti. Since the first metal layer 70 and the first interconnection lines 41 may be manufactured using the same material, the first metal layer 70 also adopts the stacked structure of Ti/Al/Ti. In this manner, the first metal wires can be prevented from breaking after the bending area 14 is bent, and the bending resistance of the display panel is enhanced.

Figure 6:
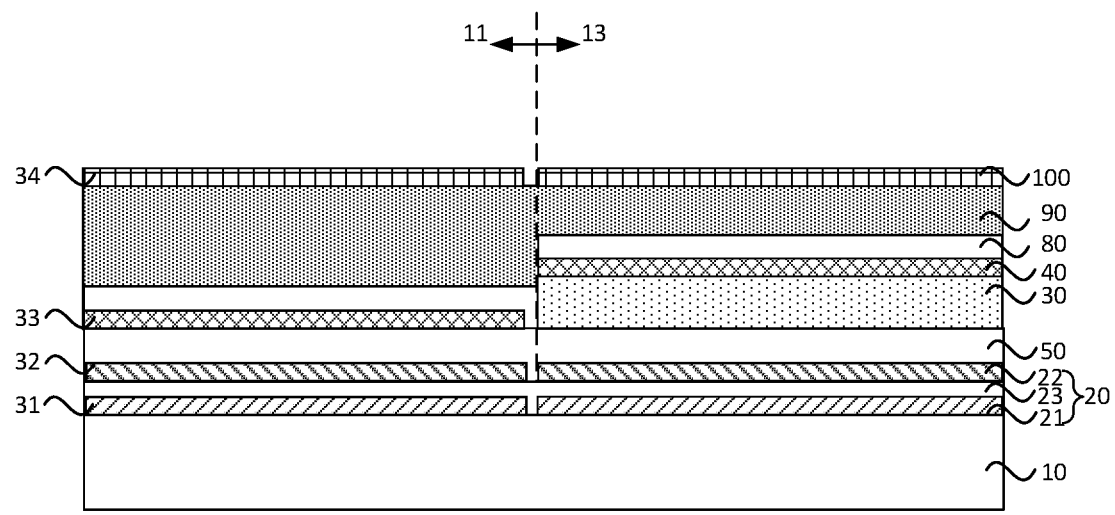
FIG. 6 is a section view of another fan-out area according to an embodiment of the present application.

Referring to FIG. 6, the fan-out area 13 may further include a second insulating layer 80, a second planarization layer 90 and a second interconnection line layer 100 disposed on the side of the first interconnection line layer 40 facing away from the substrate 10. The second planarization layer 90 covers the display area 11.

The second interconnection line layer 100 includes a plurality of second interconnection lines. The second interconnection lines may further include at least one scanning signal line, at least one resetting signal line and at least one power leading-out wire. The at least one scanning signal line, the at least one resetting signal line and the at least one power leading-out wire may be disposed in the first interconnection line layer 40 or the second interconnection line layer 100 as required. Exemplarily, the at least one scanning signal line and the at least one resetting signal line may be disposed in the first interconnection line layer 40, while the at least one power leading-out wire may be disposed in the second interconnection line layer 100.

The second planarization layer 90 may be made of an organic material. The second planarization layer 90 is disposed between the second interconnection line layer 100 and the first interconnection line layer 40, the second planarization layer 90 provides a function of planarization, so that the second interconnection line layer 100 can be manufactured on a relatively planar surface. This manner can avoid that the second interconnection line layer 100 is manufactured on a non-planar surface, photoresist residues formed in the photolithographic process makes a part of the metal fail to be etched away, thus causing short circuits between the interconnection lines.

Additionally, since an organic light-emitting structure of the display panel is required after the second interconnection layer 100 is manufactured, the second planarization layer 90 can provide a function of planarization for the display area 11 by covering the display area 11, and the second planarization layer 90 can provide a function of planarization for the fan-out area 13 and the display area 11 at the same time, thereby facilitating the subsequent manufacturing process of the organic light-emitting structure.

Referring to FIG. 5, the bending area 14 may further include a fourth metal layer 110. The fourth metal layer 110 and the second interconnection line layer 100 are disposed in the same layer. The leading-out wires lead the data lines of the display area 11 and the power lines of the display area 11 to the bonding area 12 may be distributed in the first metal layer 70 and the fourth metal layer 110.

Additionally, the second interconnection line layer 100 and the fourth metal layer 110 may also adopt the stacked structure of Ti/Al/Ti. In this manner, the retarding wires of the fourth metal layer 110 can be prevented from breaking after the bending area 14 is bent, and the bending resistance of the display panel is enhanced.

Referring to FIG. 6, the display area 11 includes a gate layer 31, a capacitor plate layer 32, a source drain layer 33 and a power signal layer 34 which are stacked on the substrate 10. The at least two metal layers 20 include a second metal layer 21 and a third metal layer 22, and a third insulating layer 33 is disposed between the second metal layer 21 and the third metal layer 22. The second metal layer 21 and the gate layer 31 are disposed in the same layer. The third metal layer 22 and the capacitor plate layer 32 are disposed in the same layer. The first interconnection line layer 40 and the source drain layer 33 are disposed in the same layer. The second interconnection line layer 100 and the power signal layer 34 are disposed in the same layer.

In the display area 11, the gate layer 31 includes a plurality of metal structures like a gate of a thin-film transistor in the pixel driving circuit and a scanning line, the capacitor plate layer 32 includes a plurality of metal structures like a plate of a capacitor in the pixel driving circuit, the source drain layer 33 includes a plurality of metal structures like the source of the thin-film transistor, the drain of the thin-film transistor and a data line, and the power signal layer 34 includes a first power signal wire and a second power signal wire which can provide power signals for the pixel driving circuit. In the fan-out area 13, the second metal layer 21 and the third metal layer 22 include leading-out wires connected with the data lines. The leading-out wires are electrically connected to the data lines in the display area 11. The second metal layer 21 and the gate layer 31 are disposed in the same layer, the third metal layer 22 and the capacitor plate layer 32 are disposed in the same layer, the first interconnection line layer 40 and the source drain layer 33 are disposed in the same layer, and the second interconnection line layer 100 and the power signal layer 34 are disposed in the same layer. Accordingly, the second metal layer 21 and the gate layer 31 may be manufactured in the same process by using the same material and the same mask, the third metal layer 22 and the capacitor plate layer 32 may be manufactured in the same process by using the same material and the same mask, the first interconnection line layer 40 and the source drain layer 33 may be manufactured in the same process by using the same material and the same mask, and the second interconnection line layer 100 and the power signal layer 34 may be manufactured in the same process by using the same material and the same mask. Therefore, the cost of the material and the cost of the manufacturing process of the display panel are reduced.

Figure 7:
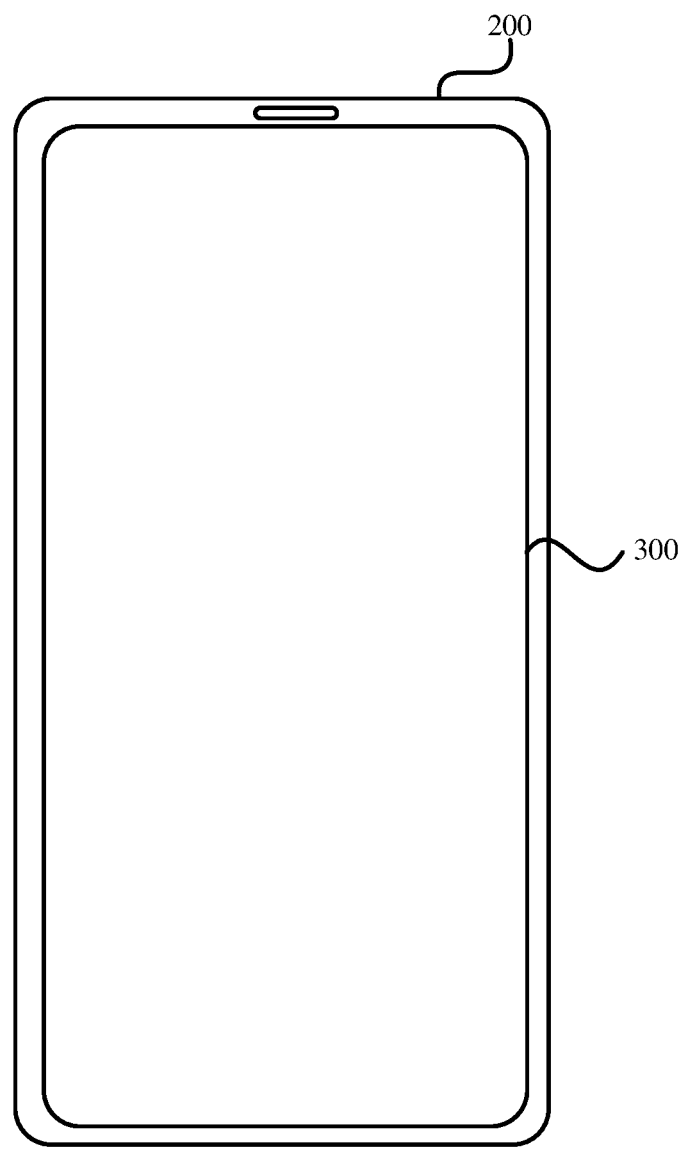
FIG. 7 is a view illustrating the structure of a display device according to an embodiment of the present application.

An embodiment provides a display device. FIG. 7 is a view illustrating the structure of a display device according to an embodiment of the present application. Referring to FIG. 7, a display device 200 according to this embodiment includes the display panel 300 described in any one of the preceding embodiments.

The display device 200 according to this embodiment of the present application may be a mobile phone, a wearable device with a display function, a computer and other display devices. The display device 200 according to this embodiment of the present application includes the display panel described in any one of the preceding embodiments. The details are not repeated here.

What is claimed is:
1. A display panel, comprising:
a substrate comprising a display area, a bonding area disposed on one side of the display area and a fan-out area disposed between the bonding area and the display area;
wherein the fan-out area comprises at least two metal layers, a first planarization layer and a first interconnection line layer which are stacked on a surface of the substrate; and
wherein the fan-out area further comprises a third insulating layer disposed between two adjacent metal layers of the at least two metal layers.
2. The display panel of claim 1, wherein the first interconnection line layer comprises a plurality of first interconnection lines, and a distance between two adjacent ones of the plurality of first interconnection lines is less than or equal to 8 microns.

3. The display panel of claim 2, wherein the plurality of first interconnection lines extend along an extending direction of a boundary where the display area intersects the fan-out area.

4. The display panel of claim 1, wherein a range of a thickness of the first planarization layer is 1 micron to 2 microns.

5. The display panel of claim 1, further comprising:
a first insulating layer disposed between the at least two metal layers and the first planarization layer.

6. The display panel of claim 1, wherein the substrate further comprises a bending area disposed between the fan-out area and the bonding area;
wherein the bending area comprises an organic layer disposed on the surface of the substrate, and the first planarization layer and the organic layer are disposed in a same layer.

7. The display panel of claim 6, wherein the bending area further comprises a first metal layer disposed on a side of the organic layer facing away from the substrate, and the first metal layer and the first interconnection line layer are disposed in a same layer.

8. The display panel of claim 7, wherein the first metal layer comprises a plurality of first metal wires, and the plurality of first metal wires comprise at least one leading-out wire which leads at least one data line of the display area and at least one power line of the display area to the bonding area.

9. The display panel of claim 1, wherein the fan-out area further comprises a second insulating layer, a second planarization layer and a second interconnection line layer which are stacked on a side of the first interconnection line layer facing away from the substrate, and the second planarization layer covers the display area.

10. The display panel of claim 9, wherein at least one of a scanning signal line, a resetting signal line and a power leading-out wire is disposed in the first interconnection line layer or the second interconnection line layer.

11. The display panel of claim 9, wherein the display area comprises a gate layer, a capacitor plate layer, a source drain layer and a power signal layer which are stacked on the substrate;
the at least two metal layers comprise a second metal layer and a third metal layer, and a third insulating layer is disposed between the second metal layer and the third metal layer; and
the second metal layer and the gate layer are disposed in a same layer, the third metal layer and the capacitor plate layer are disposed in a same layer, the first interconnection line layer and the source drain layer are disposed in a same layer, and the second interconnection line layer and the power signal layer are disposed in a same layer.

12. The display panel of claim 2, wherein each of the plurality of first interconnection lines adopts a stacked structure of Ti/Al/Ti; and
wherein the first planarization layer is made of an organic adhesive.

13. The display panel of claim 6, wherein the bending area further comprises a fourth metal layer, the fan-out area further comprises a second interconnection line layer disposed on a side of the first interconnection line layer facing away from the substrate, and the fourth metal layer and the second interconnection line layer are disposed in a same layer.

14. The display panel of claim 13, wherein the fourth metal layer and the second interconnection line layer both adopt a stacked structure of Ti/Al/Ti; and
wherein the bending area is bent towards a side of the substrate facing away from a light-emitting surface of the display panel.

15. The display panel of claim 13, wherein the bending area further comprises a first metal layer disposed on a side of the organic layer facing away from the substrate, the first metal layer and the fourth metal layer comprise at least one leading-out wire which leads at least one data line of the display area and at least one power line of the display area to the bonding area.

16. A display panel, comprising:
a substrate comprising a display area, a bonding area disposed on one side of the display area and a fan-out area disposed between the bonding area and the display area;
wherein the fan-out area comprises at least two metal layers, a first planarization layer and a first interconnection line layer which are stacked on a surface of the substrate;
wherein the substrate further comprises a bending area disposed between the fan-out area and the bonding area; and
wherein the bending area comprises an organic layer disposed on the surface of the substrate, and the first planarization layer and the organic layer are disposed in a same layer.

17. The display panel of claim 16, wherein the bending area further comprises a first metal layer disposed on a side of the organic layer facing away from the substrate, and the first metal layer and the first interconnection line layer are disposed in a same layer.

18. The display panel of claim 17, wherein the first metal layer comprises a plurality of first metal wires, and the plurality of first metal wires comprise at least one leading-out wire which leads at least one data line of the display area and at least one power line of the display area to the bonding area.

19. A display panel, comprising:
a substrate comprising a display area, a bonding area disposed on one side of the display area and a fan-out area disposed between the bonding area and the display area;
wherein the fan-out area comprises at least two metal layers, a first planarization layer and a first interconnection line layer which are stacked on a surface of the substrate;
wherein the fan-out area further comprises a second insulating layer, a second planarization layer and a second interconnection line layer which are stacked on a side of the first interconnection line layer facing away from the substrate, and the second planarization layer covers the display area.

20. The display panel of claim 19, wherein the display area comprises a gate layer, a capacitor plate layer, a source drain layer and a power signal layer which are stacked on the substrate;
the at least two metal layers comprise a second metal layer and a third metal layer, and a third insulating layer is disposed between the second metal layer and the third metal layer; and
the second metal layer and the gate layer are disposed in a same layer, the third metal layer and the capacitor plate layer are disposed in a same layer, the first interconnection line layer and the source drain layer are disposed in a same layer, and the second interconnection line layer and the power signal layer are disposed in a same layer.

\* \* \* \* \*